United States Patent [19]

Milkovic

[11] Patent Number: 4,794,333

[45] Date of Patent: Dec. 27, 1988

[54] CONTINUOUS SWITCHED-CAPACITOR DUAL SLOPE WATTHOUR METER CIRCUIT WITH CHARGE INJECTION OFFSET COMPENSATION

[75] Inventor: Miran Milkovic, Scotia, N.Y.

[73] Assignee: General Electric Company, Schenectady, N.Y.

[21] Appl. No.: 10,613

[22] Filed: Feb. 4, 1987

[51] Int. Cl.[4] ............................................. G01R 21/133
[52] U.S. Cl. ...................................................... 324/142
[58] Field of Search ......................... 324/142; 328/127; 333/173; 364/841, 844, 829, 833

[56] References Cited

U.S. PATENT DOCUMENTS

| | | | |
|---|---|---|---|
| 3,955,138 | 5/1976 | Milkovic | 324/107 |
| 4,066,960 | 1/1978 | Milkovic | 324/142 |
| 4,217,546 | 8/1980 | Milkovic | 324/142 |
| 4,439,693 | 3/1984 | Lucas et al. | 307/353 |
| 4,485,343 | 11/1984 | Milkovic | 324/142 |
| 4,495,463 | 1/1985 | Milkovic | 324/142 |
| 4,535,287 | 8/1985 | Milkovic | 324/142 |
| 4,543,534 | 9/1985 | Temes et al. | 330/9 |
| 4,636,738 | 1/1987 | Westwick et al. | 330/9 |
| 4,682,102 | 7/1987 | Milkovic | 324/142 |

OTHER PUBLICATIONS

Millman et al., *Microelectronics*, 2nd. ed.
Martin, "New Clock Feedthrough Cancellation Technique . . . ", Electronics Letters, vol. 18, No. 1, Jan. 1982, pp. 39–40.

Primary Examiner—Jerry Smith
Assistant Examiner—Stephen M. Baker
Attorney, Agent, or Firm—Marvin Snyder; James C. Davis, Jr.

[57] ABSTRACT

Transient offset error voltages due to charge injection by MOS analog switches in switched-capacitor integrators of electronic metering circuits are compensated by use of a continuous switched input capacitor network on the inverting input of the integrator amplifier. Any residual charge injection not cancelled by the switched capacitor network is compensated by employing another switched capacitor network on the non-inverting input of the amplifier and by matching the geometries of the switches in the two networks so that the charge injected into each input of the amplifier is the same.

17 Claims, 3 Drawing Sheets

CONTINUOUS SWITCHED-CAPACITOR DUAL SLOPE WATTHOUR METER CIRCUIT WITH CHARGE INJECTION OFFSET COMPENSATION

BACKGROUND OF THE INVENTION

This invention relates generally to an electronic energy consumption metering circuit capable of being fabricated on an integrated circuit chip, and more particularly to the compensation of charge injection offset caused by metal oxide semiconductor (MOS) analog switches employed in such circuit.

Electronic circuits for measuring electrical energy consumption in an electrical system, such as an AC power distribution system, are well known. Typically, these circuits may comprise a switched time division multiplier for multiplying two signals representative of the instantaneous current and voltage in the electrical system and for providing a product signal which is representative of the instantaneous power being supplied by the electrical system. The product signal from the multiplier may be integrated in an integrator circuit to provide a signal representative of the average power or energy consumption, and this signal may be converted to a pulse train in which each pulse represents a predetermined unit quantity of energy. The pulses may be counted or accumulated to provide a measure of total energy consumption. This basic technique of electronic metering is described, for example, in U.S. Pat. No. 3,955,138 which issued to the present inventor, and various electronic metering circuits employing this technique are disclosed in other patents of the present inventor, including U.S. Pat. Nos. 4,066,960; 4,217,546; 4,485,343; 4,495,463; and 4,535,287. The foregoing patents are all commonly assigned with the present invention to General Electric Company, and are incorporated by reference herein. This application is also related to the commonly assigned application of the present inventor, Ser. No. 10,607 filed concurrently herewith.

While the electronic circuits disclosed in the foregoing patents are capable of accurate metering and perform satisfactorily, it is desirable to improve their accuracy and reduce their cost and size by fabricating each of the respective circuits on a respective solid state semiconductor monolithic integrated circuit chip. It is relatively easy to fabricate components such as analog switches, amplifiers, logic elements, etc. on silicon chips using, for example, MOS technology. The present inventor's commonly assigned copending application Ser. No 812,369, filed Dec. 23, 1985, now U.S. Pat. No. 4,682,102 and Ser. No. 947,114, filed Dec. 29, 1986, which applications are incorporated by reference herein, disclose improved switched-capacitor electronic metering circuits which are capable of being fabricated entirely on integrated circuit chips. These metering circuits have an automatic offset error correction loop which employs dual slope integration for automatically compensating for system offset error voltages. The analog switches employed in the circuits comprise metal oxide semiconductor field effect transistors (MOSFETs) and introduce transient offset error voltages due to charge injection which usually cannot be fully compensated by the system offset correction loop. These uncompensate transient offset voltages introduce error and limit accuracy of the metering circuits.

It is desirable to eliminate or reduce the effects of charge injection offset caused by MOS analog switches in order to improve dynamic performance and accuracy of switched-capacitor electronic metering circuits, and the present invention is directed to this end.

SUMMARY OF THE INVENTION

The present invention constitutes an electronic metering circuit in which charge injection offset errors are substantially compensated and which affords improved dynamic performance and metering accuracy. The circuit employs a continuous or bi-linear switched-capacitor integrator and switched-capacitor networks arranged so that the net charge due to charge injection flowing into the summing point of the integrator amplifier is substantially cancelled. Any residual charge injection offset which may exist due to incomplete cancellation may be cancelled using the common mode rejection characteristics of the amplifier.

Briefly stated, in one aspect the invention contemplates an electronic circuit for measuring energy consumption in an electrical system that comprises multiplying means responsive to a voltage and current in the electrical system for providing a first signal representative of instantaneous power in the electrical system, a switched-capacitor integrator for integrating the first signal to provide a second signal representative of average energy, and means for converting the second signal into a train of pulses, each pulse of which represents a predetermined amount of energy. The switched-capacitor integrator comprises an amplifier, a feedback capacitor connected between an output and an input of the amplifier, and a switched input capacitor network between the multiplying means and the amplifier input. The switched input capacitor network comprises an input capacitor connected to integrated circuit analog switching means for switching the input capacitor between a first position at which the input capacitor is connected to the multiplying means and to the amplifier input and a second position at which the input capacitor is connected to a reference potential, and compensating means are connected to the amplifier input for compensating for a transient offset error voltage at the input due to charge injection by the integrated circuit analog switching means.

In another aspect, the invention contemplates an electronic circuit for measuring energy consumption in an electrical system that comprises a first switched-capacitor network connected between the inverting input of a switched-capacitor integrator amplifier and means which provides a signal representative of instantaneous power in the electrical system, and a second switched-capacitor network connected between the non-inverting input of the amplifier and a reference potential. The first and second switched-capacitor networks comprise integrated circuit analog switches having predetermined geometries. The predetermined geometries of switches in the first switched-capacitor network are matched to the predetermined geometries of switches in the second switched-capacitor network so that any transient offset error voltages at the amplifier due to charge injection by the switches are substantially cancelled.

DESCRIPTION OF THE PREFERRED EMBODIMENTS

The present invention is especially well adapted for use in electronic circuits fabricated in integrated circuit form for measuring energy consumption, as in watt-hours, for example, in an electrical system such as a single or polyphase AC power distribution system, and will be described in that context. However, as will become apparent, this is illustrative of only one utility of the invention.

Figure 1:
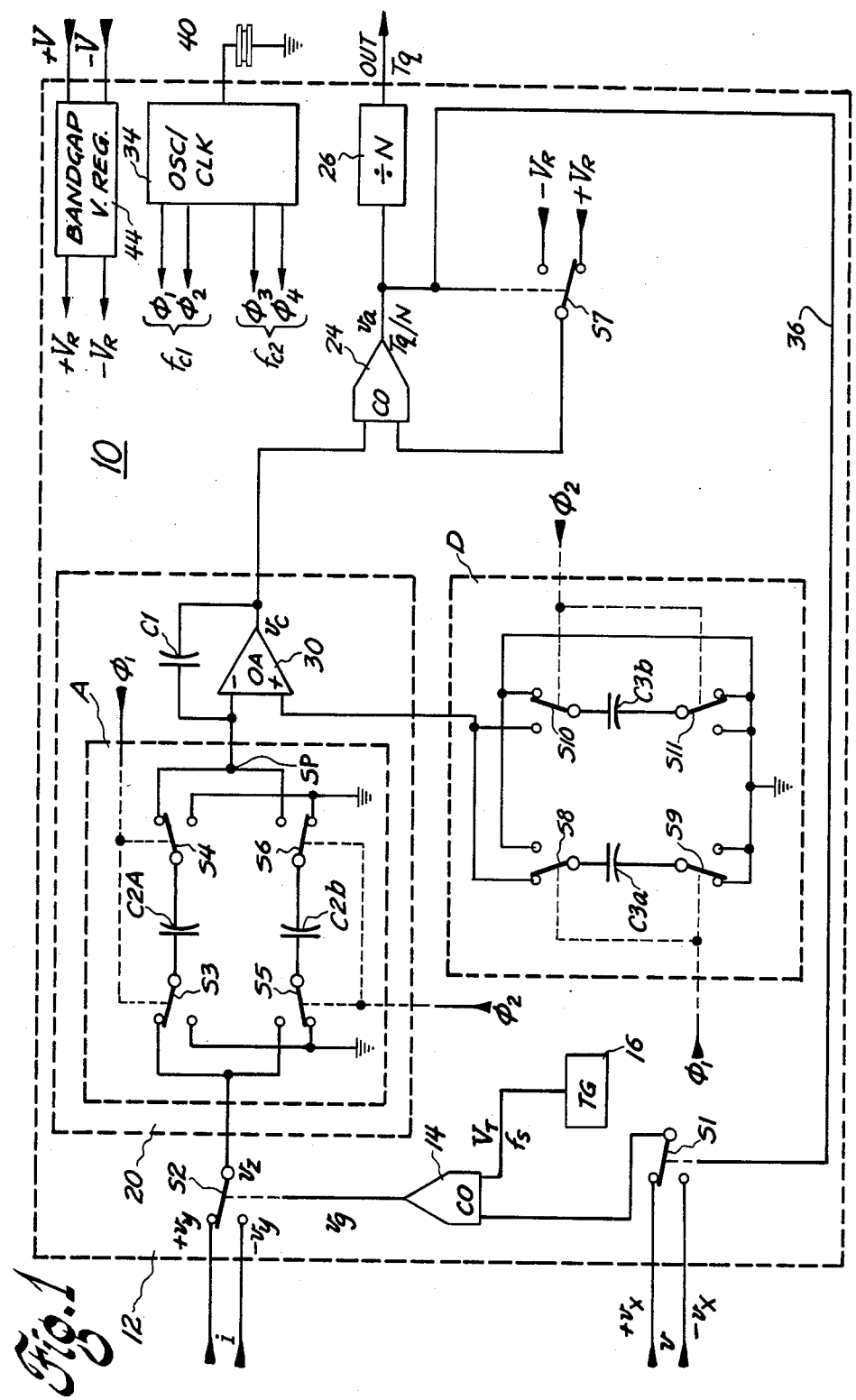
FIG. 1 is a schematic diagram of an electronic circuit employing a continuous switched-capacitor integrator and charge injection offset compensation for measuring energy consumption in a single phase electrical system.

FIG. 1 illustrates a preferred form of energy consumption metering circuit 10 in accordance with the invention for measuring energy consumption (in watt-hours, for example) in a load connected to a single phase AC power distribution system (not illustrated). As will be described in more detail herein, metering circuit 10 may be fabricated in integrated circuit form, preferably on a single monolithic MOS semiconductor integrated circuit chip 12. The instantaneous load voltage v and instantaneous load current in the electrical system may be sensed by conventional means, and corresponding voltages $v_x$ and $v_y$ which are proportional to load voltage and load current, respectively, may be supplied to circuit 10. Voltage $v_x$ may be derived, for example, from the secondary of a voltage transformer (not illustrated) connected across the voltage lines of the electrical system. Voltage $v_y$ may comprise the voltage developed across a sensing resistor (not illustrated) due to current flowing through the resistor from a current transformer (also not illustrated) which monitors the load current. Voltages $v_x$ and $v_y$ may be inverted, as by inverter amplifiers (not illustrated), and the inverted voltages $-v_x$ and $-v_y$ may also be supplied to circuit 10. Voltages $+v_x$ and $-v_x$ are preferably supplied to the terminals of a first analog switch S1, and voltages $+v_y$ and $-v_y$ are preferably supplied to the terminals of a second analog switch S2, as shown.

As will be described in more detail herein, circuit 10 may further include a time division multiplier comprising a comparator (CO) 14, a triangular waveform sampling frequency generator (TG) 16 and analog switch S2. The time division multiplier multiplies voltages $v_x$ and $v_y$ (or inverted forms thereof) together to form a voltage $v_z$ at the output of switch S2 which corresponds to the product of its two input voltages. Since the two input voltages $v_x$ and $v_y$ are proportional, respectively, to instantaneous load voltage and load current, their product $v_z$ is proportional to instantaneous power being supplied by the electrical system. Signal $v_z$ may be then integrated to convert it into a signal proportional to average energy and quantized into a train of signal pulses, each pulse of which represents a predetermined amount of energy, by an analog-to-pulse rate converter comprising a continuous or bi-linear switched-capacitor integrator 20 and a comparator (CO) 24. Voltage $v_a$ from comparator 24 may be supplied to a divider 26, such as a binary divider, which divides the pulse train by a factor N to provide an output pulse train having a pulse period $T_q$. The pulses from divider 26 may be accumulated or counted and displayed in a register/display (not illustrated) to provide an indication of energy consumption.

Comparator 14 of the time division multiplier receives at a first input either voltage $+v_x$ or voltage $-v_x$ from switch S1, and receives at a second input a triangular voltage waveform $V_T$ of frequency $f_s$ from sampling frequency generator 16. Comparator 14 constitutes a pulse-width modulator which outputs pulse-width modulated pulses, wherein the instantaneous pulse width of an output pulse is proportional to the corresponding instantaneous magnitude of input voltage from switch S1. The pulse-width modulated output signal of th comparator controls the position of switch S2 so that output voltage $v_z$ from the switch comprises a train of pulses which alternate in polarity. Magnitude of any given pulse in this train is proportional to line current while width or mark-space ratio of the pulses is proportional to line voltage. Thus voltage $v_z$ is proportional to instantaneous power, as explained, for example, in aforementioned U.S. Pat. No. 3,955,138. The time division multiplier output product voltage $v_z$ is preferably provided about 100 times for each period of the line frequency. Accordingly, for a 60 Hz line frequency, samplnng frequency $f_s$ provided by sampling frequency generator TG is preferably of the order of 6 KHz.

Continuous or bi-linear switched-capacitor integrator 20, which integrates product signal $v_z$, is a dual slope integrator, as will be described, and may comprise an operational amplifier (OA) 30, a feedback capacitor C1 connected between the output of the amplifier and its inverting (−) input, and a switched input capacitor network A comprising a pair of capacitors C2a and C2b, having the same value, connected in parallel by corresponding pairs of analog switches S3, S4, and S5, S6, respectively. The switches may be controlled in pairs by clock phase signals $\phi_1$, $\phi_2$ which are derived from an oscillator/clock generator 34 fabricated directly on chip 12. The clock phase sinnals are non-overlapped and 180 degrees out of phase. Frequency $f_{c1}$ of the clock signals is preferably high in relation to frequency $f_s$ of sampling frequency generator 16, and may be, for example, of the order of 30 KHz.

Switches S3 and S4 are operated together as a pair and switches S5 and S6 are operated together as a pair to connect respective capacitors C2a and C2b alternately to the output of switch S2 and the inverting (−) input of the operational amplifier, and to a reference potential such as ground. Thus, when switches S3 and S4 are in the positions illustrated in FIG. 1, capacitor C2a provides signal $v_z$ to operational amplifier 30 of the integrator. At this time, switches S5 and S6 connect capacitor C2b to ground. When the phases of the cock signal reverse, the positions of switches S3–S6 reverse, causing capacitor C2a to be connected to ground and capacitor C2b to be inserted between the output of switch S2 and the input of the operational amplifier. Thus, product signal $v_z$ is supplied substantially continuously (except for the switching time) to the integrator amplifier. Switches S3–S6, in combination with capacitors C2a and C2b, effectively constitute a sampling circuit which samples signal $v_z$ and supplies the sampled signal to the operational amplifier. This signal is integrated up in capacitor C1. Thus, output signal $v_c$ of operational amplifier 30 is a ramp signal with a constant slope formed by superimposed small steps due to sample integration. In addition, a $2\omega t$ component is superimposed upon the ramp signal due to the effect of multiplication of the input voltages. This component, however, is cancelled out in balanced polyphase loads. The integrator output signal $v_c$ is thus the time integral of input voltage $v_z$ with a time constant of (C1/C2) $T_{c1}$, where C2 is the value of capacitors C2a and C2b (which have equal values) and $T_{c1} = 1/f_{c1}$. Output signal $v_c$ represents the average energy being consumed in the electrical system.

Sinal $v_c$ from integrator 20 may be quantized and converted into a train of signal pulses $v_a$ by comparator 24 wherein each pulse represents a fraction 1/N of a predetermined quantity of energy, where N is the divisor of a divider 26. Signal $v_c$ from the integrator is supplied to one input of comparator 24, and a reference voltage $+V_R$ or $-V_R$ is supplied to the other input of the comparator as determined by the position of a switch S7. Switch S7 is controlled by the output of the comparator to switch between the two reference voltages, and the output of the comparator is also fed back via a conductor 36 to control the position of switch S1. During a first tmmepperiod $T_u$, switch S7 may be in the position shown and integrator 20 may integrate signal $v_z$ upwardly so that output ramp voltage $v_c$ from the integrator increases. When this voltage reaches the positive reference voltage, the comparator output voltage goes high to produce an output pulse. This pulse operates switch S7 to reverse polarity of the reference voltage supplied to comparator 24 and operates switch S1 to reverse polarity of input voltage v to comparator 14. Reversing polarity of voltage v from $+v_x$ to $-v_x$ causes the integrator to integrate downwardly during the next time period $T_d$. Upon the output signal from the integrator reaching the negative reference voltage, comparator 24 changes state by going low, which again reverses polarity of input voltage v to comparator 14 so that the integrator starts to integrate upwardly again. This cycle repeats with integrator 20 integrating first in one direction and then the other. Thus, the integrator is a dual slope integrator and output voltage $v_a$ of comparator 24 is in the form of a pulse train wherein each pulse represents a predetermined amount of energy. Assuming for the moment that divider 26 is not present, i.e., N=1, the energy per output pulse is $$W_q(k_1 V_R^2/kf_{c1}) (C1/C2) \text{ (Joules)} \quad (1)$$

and the output rate is $$1/T_q = (kf_{c1}/k V_R^2)(C2/C1) \text{ VI cos } \theta (1/\text{sec.}) \quad (2)$$

where $k_1$ and k are dimensional constants, VI cos $\theta$ is the load power, $V_R$ is the reference voltage, and $f_{c1}$ is the clock frequency.

From Equation (1). it can be seen that energy per output pulse depends only on clock frequency $f_{c1}$, reference voltage $V_R$, and the ratio C1/C2. Thus, accuracy with which energy may be measured depends upon accuracy of these terms. It is desirable that circuit 10 have an accuracy of ±0.1%. Oscillator/clock generator 34 may be controlled by a crystal 40 so that clock frequency $f_{c1}$ has an accuracy much greater than ±0.1. Reference voltages $±V_R$ may be derived from voltages $+V$ and $-V$ by a bandgap voltage regulator 44 fabricated directly on chip 12, and the voltage regulator may be formed to be quite accurate using conventional techniques. As to the capacitor ratio, it is relatively easy to match the temperature and voltage coefficients of capacitors formed on a single silicon chip so that these coefficients track each other over a relatively wide range of temperature and voltage. Thus it is possible to obtain a desired capacitor ratio which is accurate to within ±0.1%, even though the absolute values of the capacitors may vary substantially from the target values.

As described in the aforementioned application Ser. No. 947,114 divider 26 enables the capacitance ratio of the feedback capacitor to the input capacitor of switched-capacitor integrator 20 to be substantially reduced (by a factor corresponding to the reciprocal of divisor N) so that the capacitance values of the capacitors are of the same order of magnitude. This produces a corresponding increase in integration speed, enables better matching of the capacitors, permits reduction of chip area, and affords substantially improved linearity.

The circuit of FIG. 1 affords automatic compensation of system offset voltages. This is accomplished since, during up-integration period $T_u$ of signal $v_z$, system error voltages are integrated up, causing a time error of $+T_e$. However, when the integrator 20 output voltage reaches the reference voltage level and the comparator 24 output voltage changes state, input voltage v to comparator 14 reverses polarity, as previously described, causing the product signal $v_z$ to reverse polarity so that the integrator integrates down during down-integration interval $T_d$. Although the integrator input signal $v_z$ reverses polarity, the system offset error voltage does not and causes a time error of $-T_e$. Therefore, during the total period $T_u + T_d$, the offset time errors are subtracted and thus automatically eliminated.

As previously noted, circuit 10 is preferably fabricated entirely on a single integrated circuit chip. The various analog switches employed in the circuit are preferably MOS integrated circuit switches which are formed in conventional manner and which employ field effect transistors (FETs). The switches are controlled by application of gate voltages to the FETs. When a FET is turned off, as by application of a negative gate voltage for example, there is no channel through the FET. When a positive gate voltage is applied, a channel is created due to inversion and charge is injected into the channel so that it conducts. Charge is stored in stray capacitances as, for example, between the source and drain and the substrate. When the FET is turned off, the charge flows out through the source and drain connections. Charge injection produces a transient offset error voltage which is added to the signal being processed. Such offset error voltage is usually too large to be fully compensated by the system automatic offset compensation loop described above, and this limits accuracy of the metering circuit.

In accordance with the invention, circuit 10 employs means for compensating for such charge injection offsets. When switch S4 (and S3) of continuous switched input capacitance network A is on, capacitor C2a is connected to the summing point SP of integrator amplifier 30. The charge in the inversion layer of switch S4 is equal to ΔQ. However, since switch S6 is off, there is no inversion layer charge present in switch S6 and thus ΔQ=0 therein. Subsequently, switch S4 is turned off by a negative gate voltage on its control terminal, and switch S6 is turned on by a positive gate voltage. As a consequence, the net charge flowing into the summing point is ideally cancelled if switches S4 and S6 are constructed to have equal geometries, as is typically the case in monolithic circuits. Accordingly, the charge injection offset at the summing point may be substantially cancelled by close matching of the geometries of switches S4 and S6.

A complete matching of geometries, however, may not be possible. Thus, a residual charge injection offset may exist at summing point SP of integrator amplifier 30. This residual charge injection offset may be cancelled by employing a compensating switched input capacitor network D connected to the non-inverting (+) input of integrator amplifier 30. Network D has a structure similar to that of network A, and may comprise first and second capacitors C3a and C3b connectd in parallel by pairs of analog switches S8, S9 and S10, S11, respectively, as shown. Switches S8 and S9 are controlled by the same clock phase $\phi_1$ as that which controls switches S3 and S4, and switches S10 and S11 are controlled by the same clock phase $\phi_2$ as that which controls switches S5 and S6. Switches S8-S11 function in a manner similar to switches S3-S6 to connect capacitors C3a and C3b alternately to a reference potential, such as ground, and to the non-inverting input of amplifier 30. Capacitors C3a and C3b are preferably selected to have the same value as capacitors C2a and C2b, and the geometries of switches S8-S11 are selected to match the geometries of corresponding switches S3-S6 of Network A. Accordingly, the charge injection into the non-inverting input of amplifier 30 due to network D will be the same as that injected into the inverting input of the amplifier by network A, and the transient offset error voltage due to charge injection will be compensated and substantially eliminated because of the common mode rejection characteristics of the amplifier.

Figure 2:
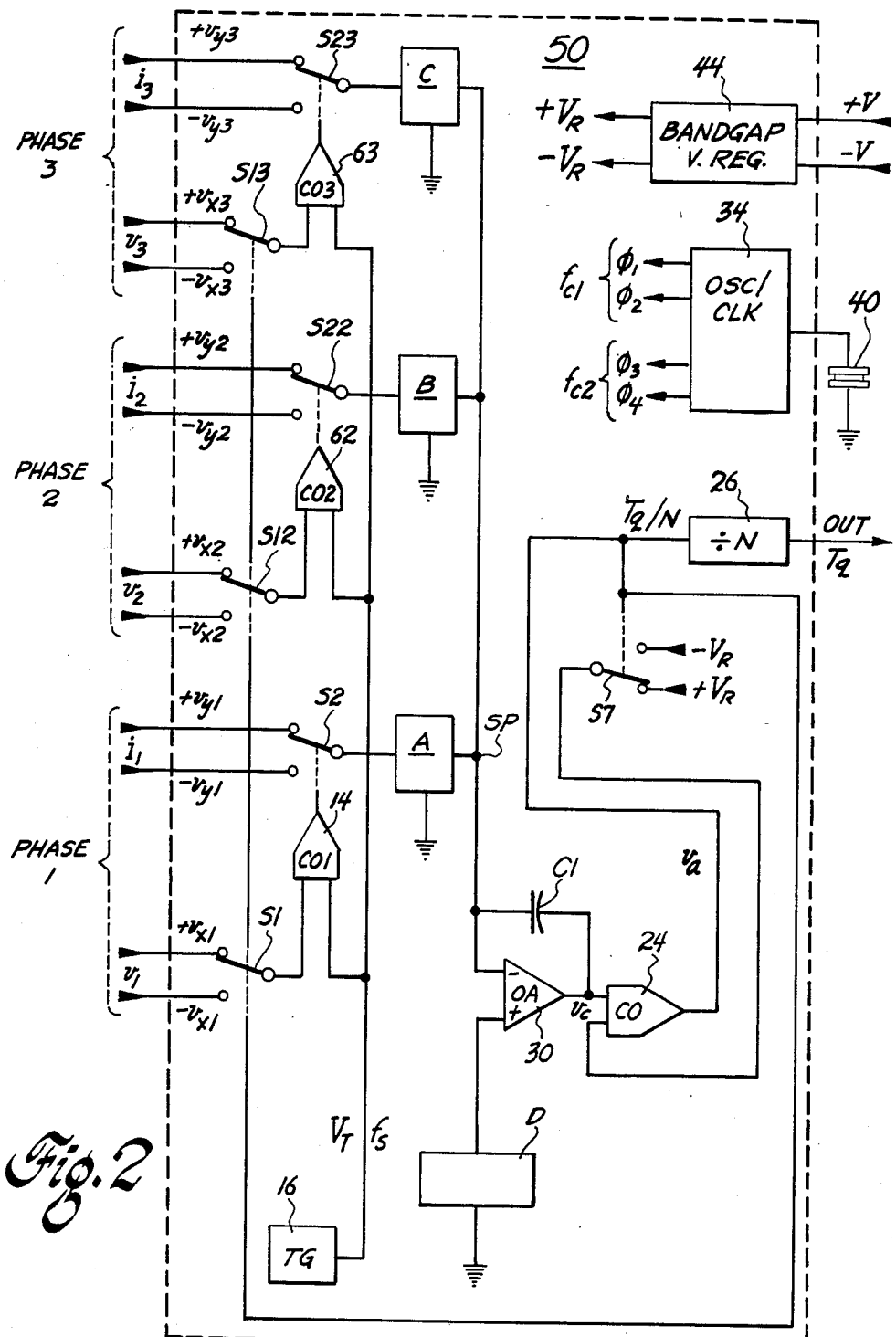
FIG. 2 is a schematic diagram of an electronic circuit similar to the circuit of FIG. 1 for measuring energy consumption in a polyphase electrical system.

The circuit of FIG. 1 has been described in connection with metering energy consumption in a single phase electrical system. FIG. 2 illustrates an electronic circuit 50 for metering energy consumption in a polyphase electrical system, the circuit being illustrated for a three-phase electrical system. Circuit 50, which is preferably formed on a single integrated circuit chip 52, is similar to circuit 10 and corresponding elements are referenced by the same designators. The lower part of FIG. 2 (for the Phase 1 input signals $v_1$ and $i_1$) corresponds identically to circuit 10 of FIG. 1, the networks A and D being illustrated in FIG. 2 as blocks to simplify the drawing, and operates in the manner previously described. Circuit 50 further comprises, for Phases 2 and 3, polarity-reversing switches S12 and S13, respectively, which function in a manner similar to switch S1, and time division multipliers comprising a comparator 62 driving a switch S22 for Phase 2 and a comparator 63 driving a switch S23 for Phase 3. For each Phase i where i=1,2,3, circuit 50 receives voltages $\pm v_{xi}$ proportional to voltage in each phase and receives voltages $\pm v_{yi}$ proportional to current in each phase. The time division multipliers multiply the voltages together, in the manner previously described, to form corresponding product signals $v_{zi}$ proportional to instantaneous power in each phase. Circuit 50 further comprises, for Phases 2 and 3, switched input capacitor networks B and C for receiving corresponding product signals $v_{z2}$ and $v_{z3}$, respectively. Networks B and C are preferably identical to network A and function in the same manner as network A. The outputs of networks B and C are coupled to each other and, along with the output from network A, are coupled to summing point SP of integrator amplifier 30. Accordingly, the total signal at the input of the integrator amplifier is $v_z=v_{z1}+v_{z2}+v_{z3}$, which is proportional to polyphase instantaneous power, and the output signal of the integrator amplifier corresponds to total average energy in the polyphase system. This output signal is quantized into pulses by comparator 24, as previously described, such that each pulse supplied from circuit 50 represents a predetermined amount of energy measured, for example, in watthours. Oscillator/clock generator 34 supplies clock signals to each of networks B and C, as well as to network A.

For metering three-phase power, the switched input capacitors (corresponding to capacitors C2a and C2b shown in FIG. 1) of networks A-C all have the same value, and the values of capacitors C3a and C3b of network D (and shown in FIG. 1) are increased by a factor of three so that each capacitor C3a and C3b has a value equal to the sum of the values of the corresponding capacitors C2a and C2b, respectively, of networks A-C. In addition, the geometries of switches S8-S11 of network D are increased by a factor of three in order to match the total gate areas of the corresponding switches of networks A, B, and C so that the total charge injected into the non-inverting input of integrator amplifier 30 by network D is equal to the sum of the charges injected into the inverting input of the amplifier by the three switched input capacitor networks A-C. Thus, offset error voltages due to charge injection by the switches of networks A-C are compensated by the common mode rejection characteristics of the amplifier.

Polarity reversing switches S1, S12 and S13 of circuit 50 may all be controlled simultaneously by output voltage $v_a$ of comparator 24 for automatic correction of system offset error voltages, as previously described. In addition, as shown in FIG. 2, the triangular waveform sampling voltage for comparators 14, 62 and 63 of the time division multipliers of the three phases may be supplied in parallel from the output of sampling generator 16.

Figure 3:
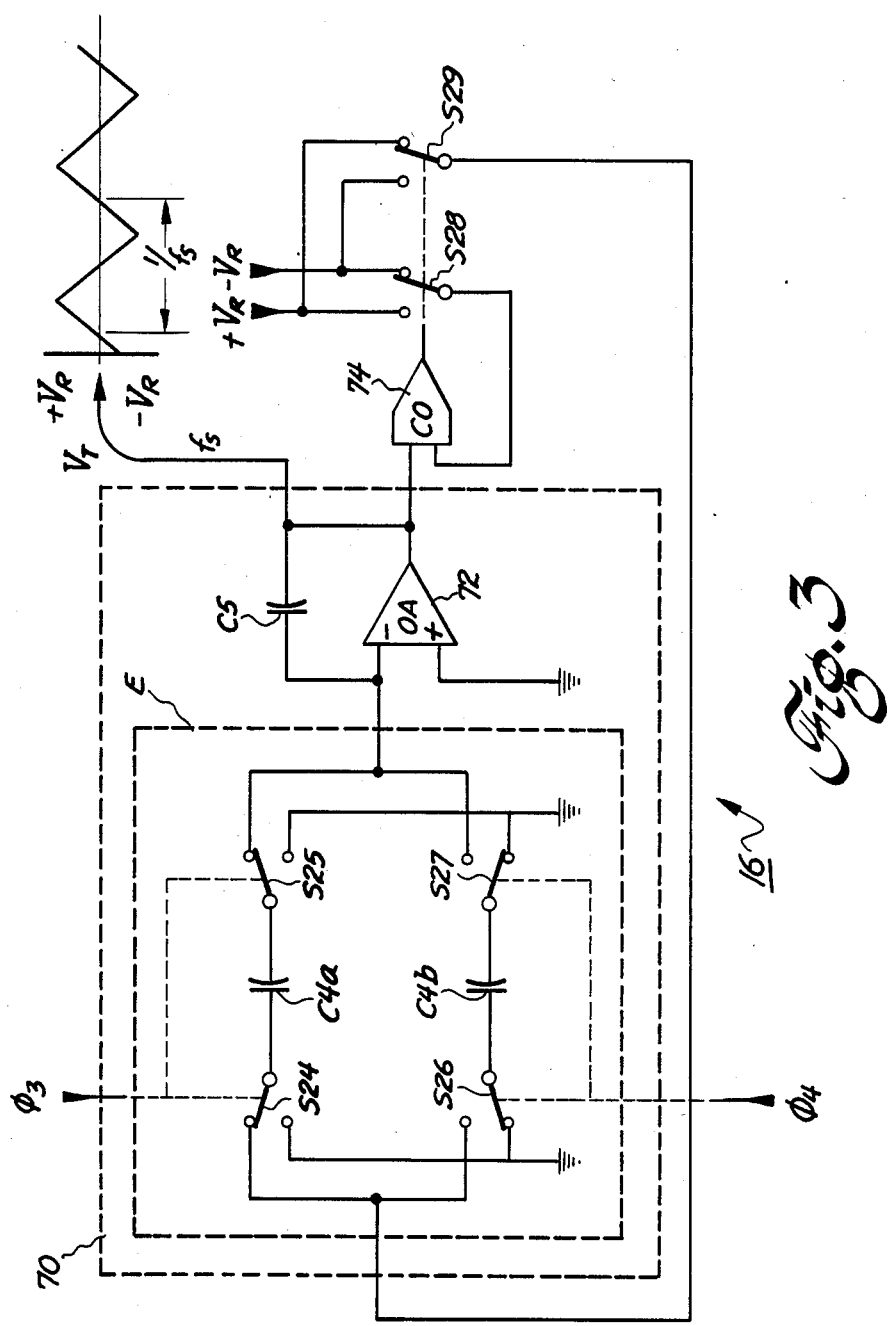
FIG. 3 is a schematic diagram of a triangular waveform sampling generator which may be employed in the circuits of FIGS. 1 and 2.

FIG. 3 illustrates a preferred form of triangular waveform sampling frequency generator 16 shown in block form in FIGS. 1 and 2. Generator 16 may comprise a continuous switched input capacitor dual slope integrator 70, which is similar to integrator 20 of FIG. 1. Integrator 70 may comprise a switched input capacitor network E comprising capacitors C4a and C4b which are switched alternately by corresponding pairs of switches S24, S25 and S26, S27, respectively, between a first position at which one of the capacitors applies a reference voltage $-V_R$ or $-V_R$, as selected by switch S29, to the inverting input of an operational amplifier (OA) 72 and the other of the capacitors is connected to a reference potential, such as ground, and a second position at which the order of the aforesaid capacitor connections is reversed. Switches S24, S25 and S26, S27 may be controlled in pairs by non-overlapping clock phases $\phi_3$ and $\phi_4$ which are 180 degrees out of phase, in a manner similar to that described for the switches of network A of integrator 20 of FIG. 1. The clock phases have a frequency $f_{c2}$ which is preferably large, for example, 60 KHz, in relation to the sampling frequency $f_s$, and may be derived from oscillator/clock generator 34, shown in FIG. 1. Integrator amplifier 72 has a feedback capacitor C5 connected between its output and its inverting input, and the output of the amplifier is coupled to one input of a cmmparator (CO) 74. The other input of comparator 74 is supplied with one of the reference voltages $\pm V_R$, as determined by the position of a switch S28. The output of comparator 74 controls the positions of switches S28 and S29. With all switches in the positions illustrated in FIG. 3, voltage $+V_R$ is applied to the input of network E and voltage $-V_R$, is applied to the second input of comparator 74. Integrator 70 integrates the input reference voltage so that the output signal of amplifier 72 is a decreasing ramp voltage. When the output signal of amplifier 72 reaches voltage $-V_R$, comparator 74 changes state and reverses the positions of switches S28 and S29. This reverses polarity of both the input voltage to network E and the reference voltage to comparator 74, so that the output voltage of integrator amplifier 72 increases. When the output voltage of amplifier 72 reaches $+V_R$, comparator 74 changes state once again, returning switches S28 and S29 to their original positions. Thus the output voltage of integrator amplifier 72 is a triangularly-shaped waveform $V_T$ as shown, formed by alternately increasing and decreasing ramp voltages which vary between the reference voltages $+V_R$ and $-V_R$ with slopes of $\pm(C4a/C5)f_{c2}$, when the open loop gain of amplifier 72 is much greater than one.

From the foregoing, it will be appreciated that the invention affords significant advantages in compensating for offset error voltages in electronic metering circuits which employ switched-capacitor integrators, and affords metering circuits having improved accuracy. Transient offset error voltages due to charge injection of MOS analog switches are substantially compensated by employing a continuous switched input capacitor network on the inverting input of the integrator amplifier. Any residual charge injection not cancelled by the continuous switched input capacitor network is compensated by employing another continuous switched capacitor network on the non-inverting input of the amplifier and by appropriately matching the geometries of the switches of the two networks.

While preferred embodiments of the invention have been shown and described, it will be appreciated by those skilled in the art that changes may be made in these embodiments without departing from the principles and the spirit of the invention, the scope of which is defined in the appended claims.

What is claimed is:

1. An electronic circuit for measuring energy consumption in an electrical system comprising:

multiplying means responsive to a voltage and a current in said electrical system for providing a first signal representative of instantaneous power in the electrical system;

a switched-capacitor integrator for integrating the first signal to provide a second signal representative of average energy, said integrator comprising an amplifier, a feedback capacitor connected between an output and an input of the amplifier, and a switched input capacitor network coupled between said multiplying means and said amplifier input, said switched input capacitor network comprising an input capacitor, analog switching means for switching the input capacitor between a first position at which the input capacitor is connected between the multiplying means and the amplifier input, and a second position at which the input capacitor is disconnected from said amplifier, said network further comprising means for compensating for a transient offset error voltage at said amplifier input due to charge injection by said analog switching means;

means for converting the second signal into a train of pulses, each pulse of which represents a predetermined amount of energy consumed in said electrical system; and a second input capacitor and second analog switching means for switching said second input capacitor between a first position at which said second input capacitor is connected between the multiplying means and the amplifier input, and a second position at which said second input capacitor is disconnected from said amplifier, and means for operating each of said analog switching means such that when the first-mentioned input capacitor is in the first position, the second input capacitor is in the second position, and vice-versa.

2. The circuit of claim 1 wherein said means for operating each of said switching means operates both said switching means substantially simultaneously such that said first signal is provided substantially continuously to the switched-capacitor integrator.

3. The circuit of claim 1 wherein said input of said amplifier is an inverting input, said amplifier includes a non-inverting input, and said compensating means comprises a second switched input capacitor network connected between said non-inverting input and reference potential.

4. The circuit of claim 3 wherein said second switched input capacitor oomprises third and fourth input capacitors and corresponding third and fourth analog switching means coupled to said third and fourth input capacitors, respectively, for alternately switching each of said third and fourth input capacitors between said noninverting input and said refer potential.

5. The circuit of claim 4 wherein each of said analog switching means comprises a pair of MOS analog switches, each of said switches having a predetermined geometry, and wherein the geometries of the switches of the switched input capacitor networks connected to said inverting input are matched to the geometries of the switches of said switched input capacitor networks connected to said non-inverting input such that substantially the same charge is injected into each input of said amplifier said switches.

6. The circuit of claim 1 wherein said multiplying means comprises a time division multiplier for multiplying a third signal proportional to voltage in said system and a fourth signal proportional to current in said system to provide said first signal representative of instantaneous power, said time division multiplier comprising a comparator for receiving at a first input thereof one of said third and fourth signals and for receiving at a second input thereof a triangular waveform sampling frequency, and additional analog switching means controlled by said comparator for receiving the other one of said third and fourth signals.

7. The circuit of claim 1 wherein said electrical system comprises a plural phase electrical system, and said multiplying means includes means for providing corresponding first signals representative of instantaneous power in each phase of said system, said circuit including an additional switched input capacitor network for each additional phase to receive each of said corresponding first signals, respectively, and means for connecting the output of each of said additionalsswitched input capacitor networks to said amplifier input.

8. The circuit of claim 7, said circuit being fabricated entirely in integrated circuit chip form.

9. The circuit of claim 1, said circuit being fabricated entirely in integrated circuit chip form.

10. An electronic circuit for measuring energy consumption in an electrical system comprising:

multiplying means responsive to a voltage and a current in said electrical system for providing a first signal representative of instantaneous power in the electrical system;

a switched-capacitor integrator for integrating the first signal to provide a second signal representative of average energy, said integrator comprising an amplifier having an inverting input and a non-inverting input, a feedback capacitor connected between the output of the amplifier and said inverting input, a first switched-capacitor network connected between said inverting input and said multiplying means, and a second switched capacitor network connected between said non-inverting input and a reference potential, said first and second switched-capacitor networks each comprising a respective analog switch having a predetermined geometry, the predetermined geometries of the switches of said first and second switched-capacitor networks being matched such that transient offset error voltages at said amplifier due to charge injection by said switches are substantially cancelled; and means for converting the second signal into a train of pulses, each pulse of which represents a predetermined amount of energy.

11. The circuit of claim 10 wherein the first switched-capacitor network comprises a first capacitor and first pair of MOS switches coupled in series with said first capacitor and arranged to switch the first capacitor alternately between a first position at which the first capacitor is connected to the multiplying means and to said inverting input and a second position at which the first capacitor is connected to the reference potential, and a second capacitor and second pair of MOS switches coupled in series with said second capacitor, said second capacitor and second pair of MOS switches being connected in parallel with said first capacitor and first pair of switches, the second pair of switches being arranged to connect the second capacitor alternately in said first position and in said second position, and means for controlling the first and second pairs of switches such that upon the first capacitor being switched to the first position, the second capacitor is switched to the second position, and vice-versa.

12. The circuit of claim 11 wherein the second switched-capacitor network comprises a third capacitor and third pair of MOS switches coupled in series with said third capacitor, said third capacitor and third pair of MOS switches being connected in parallel with a fourth capacitor and a fourth pair of MOS switches coupled in series with said fourth capacitor, said third and fourth pairs of MOS switches being arranged to switch the third and fourth capacitors, respectively, alternately and oppositely between a third position at which one of said third and fourth capacitors is connected to the non-inverting input of the amplifier and a fourth position at which the one of said third and fourth capacitors is connected to the reference potential, the switches of said third and fourth pairs being formed such that their geometries are matched to the geometries of the switches of the and second pairs.

13. The circuit of claim 12, wherein said first, second, third and fourth capacitors are all of the same capcitance value.

14. The circuit of claim 12 wherein said electrical system comprises a plural phase electrical system and said multiplying means includes means for providing corresponding first signals representative of instantaneous power in each phase of said system, and wherein the switched-capacitor integrator includes an additional first switched-capacitor network connected between the multiplying means of each phase, respectively, and the inverting input of said amplifier, each of the switches of said second switched-capacitor network, respectively, having a geometry matched to the total geometries of the corresponding switches, respectively, of each of said first switched-capacitor networks.

15. The circuit of claim 14 wherein each of the first and second capacitors of the first switched-capccitor networks has the same first capacitance value and each of the third and fourth capacitors of the second switched-capacitor network has the same second capacitance value, and wherein the second capacitance value is equal to m times the first capacitance value, where m is equal to the total number of said first switched-capacitor networks.

16. The circuit of claim 14 wherein said multiplying means comprises, for each phase: means for receiving a first voltage proportional to instantaneous voltage in said eeach phase; means for receiving a second voltage proportional to instantaneous current in said each phase; and a multiplier for multiplying the first and second voltages to form said first signals representative of instantaneous power, said multiplier comprising a comparator for receiving at a first input thereof one of said first and second voltages and for receiving at a second input thereof a triangular waveform sampling frequency; and a switch controlled by said comparator for receiving the other of said first and second voltages.

17. The circuit of claim 16 further comprising automatic offset error voltage correction means for compensating for other offset error voltages, said correction means comprising means responsive to said train of pulses for reversing polarity of said one of said first and second voltages supplied to said comparator in accordance with said pulses in order to reverse polarity of said first signal.

* * * * *